(12) United States Patent
Darche et al.

(10) Patent No.: US 11,083,102 B1
(45) Date of Patent: Aug. 3, 2021

(54) MODULAR DISTRIBUTION FRAMES AND ASSEMBLIES

(71) Applicant: Amazon Technologies, Inc., Seattle, WA (US)

(72) Inventors: Randall Darche, Seattle, WA (US); Zachary Jackson, Elkton, MD (US); Jason Michael Long, Bainbridge Island, WA (US); Tom Murphy, Fort Wayne, IN (US); Dana Whitford, Tacoma, WA (US)

(73) Assignee: Amazon Technologies, Inc., Seattle, WA (US)

( * ) Notice: Subject to any disclaimer, the term of this patent is extended or adjusted under 35 U.S.C. 154(b) by 49 days.

(21) Appl. No.: 16/709,203

(22) Filed: Dec. 10, 2019

(51) Int. Cl.
| | |
|---|---|
| *H05K 7/02* | (2006.01) |
| *H02B 1/56* | (2006.01) |
| *H02B 1/20* | (2006.01) |
| *H02B 1/01* | (2006.01) |

(52) U.S. Cl.
CPC ............. *H05K 7/023* (2013.01); *H02B 1/013* (2013.01); *H02B 1/202* (2013.01); *H02B 1/565* (2013.01)

(58) Field of Classification Search
CPC ........ H02B 1/013; H02B 1/202; H02B 1/565; H05K 7/023; H05K 7/026
See application file for complete search history.

(56) References Cited

U.S. PATENT DOCUMENTS

| | | |
|---|---|---|
| 7,225,980 B2 | 6/2007 | Ku et al. |
| 7,949,568 B2 | 5/2011 | Fano et al. |
| 8,009,864 B2 | 8/2011 | Linaker et al. |
| 8,175,925 B1 | 5/2012 | Rouaix |
| 8,189,855 B2 | 5/2012 | Opalach et al. |
| 8,423,431 B1 | 4/2013 | Rouaix et al. |
| 8,630,924 B2 | 1/2014 | Groenevelt et al. |
| 8,688,598 B1 | 4/2014 | Shakes et al. |
| 9,473,747 B2 | 10/2016 | Kobres et al. |

(Continued)

OTHER PUBLICATIONS

Abhaya Asthana et al., "An Indoor Wireless System for Personalized Shopping Assistance", Proceedings of IEEE Workshop on Mobile Computing Systems and Applications, 1994, pp. 69-74, Publisher: IEEE Computer Society Press.

(Continued)

*Primary Examiner* — Jacob R Crum

(74) *Attorney, Agent, or Firm* — Athorus, PLLC

(57) ABSTRACT

Cable housing assemblies include frames and cable carriers slidably mounted to channels provided at edges of the frames. The cable carriers may house or support male or female connectors to the cables, which may be power or communications cables (e.g., Ethernet cables) that extend from the connectors within the cable carriers into the channels, and through voids within the frames to power sources or communications systems. The cable carriers are releasably inserted into channels at edges of the frames, and permitted to slide in either direction (e.g., up or down) to various positions within such channels, in order to make power or communications services available at such positions. When installed in association with a shelving unit, e.g., between a backerboard and shelves, the cable carriers may be used to provide power or communications services available to such shelves provided at any height within the shelving unit.

20 Claims, 11 Drawing Sheets

(56) References Cited

U.S. PATENT DOCUMENTS

| | | |
|---|---|---|
| 2003/0002712 A1 | 1/2003 | Steenburgh et al. |
| 2004/0181467 A1 | 9/2004 | Raiyani et al. |
| 2007/0192817 A1* | 8/2007 | Landry .............. H05K 7/16 725/119 |
| 2007/0210679 A1* | 9/2007 | Adducci .............. H05K 7/186 312/7.2 |
| 2008/0055087 A1 | 3/2008 | Horii et al. |
| 2008/0077511 A1 | 3/2008 | Zimmerman |
| 2008/0109114 A1 | 5/2008 | Orita et al. |
| 2009/0121017 A1 | 5/2009 | Cato et al. |
| 2009/0245573 A1 | 10/2009 | Saptharishi et al. |
| 2010/0219726 A1* | 9/2010 | Nicewicz .............. H02G 3/32 312/223.2 |
| 2010/0290604 A1* | 11/2010 | Wright .............. H05K 13/00 379/102.04 |
| 2011/0011936 A1 | 1/2011 | Morandi et al. |
| 2012/0284132 A1 | 11/2012 | Kim et al. |
| 2013/0076898 A1 | 3/2013 | Philippe et al. |
| 2013/0253700 A1 | 9/2013 | Carson et al. |
| 2014/0279294 A1 | 9/2014 | Field-Darragh et al. |
| 2014/0362223 A1 | 12/2014 | LaCroix et al. |
| 2015/0000214 A1* | 1/2015 | Gardner .............. E04B 1/34384 52/64 |
| 2015/0019391 A1 | 1/2015 | Kumar et al. |
| 2015/0073907 A1 | 3/2015 | Purves et al. |
| 2016/0241002 A1* | 8/2016 | Tremaine .............. H02B 1/38 |
| 2020/0011098 A1* | 1/2020 | Pruitt .............. E05C 17/085 |

OTHER PUBLICATIONS

Cristian Pop, "Introduction to the BodyCom Technology", Microchip AN1391, May 2, 2011, pp. 1-24, vol. AN1391, No. DS01391A, Publisher: 2011 Microchip Technology Inc.

* cited by examiner

MODULAR DISTRIBUTION FRAMES AND ASSEMBLIES

BACKGROUND

Increases in computer processing power and network connectivity speeds, and reductions in component size, have enabled computer-based systems to be utilized in connection with nearly every aspect of our daily lives, including traditional bricks-and-mortar commerce. In shopping facilities, such as materials handling facilities, computer-based systems having one or more sensors (e.g., digital cameras, load sensors, or others), have been integrated into traditional retail structures or components (e.g., shelves) in order to aid in theft prevention or inventory tracking.

Computer-based systems, however, traditionally require hard-wired connections to power sources and communications systems or networks. Where a retail establishment or other materials handling facility includes dozens, hundreds or even thousands of sensors, however, each requiring power or communications connections at varying voltage levels, power ratings or network bandwidth or throughput, the number and length of current-carrying or communications cabling may be substantial. Therefore, a retail establishment or other materials handling facility may be required to allocate significant portions of interior spaces to house or otherwise maintain power supplies, network switches, modems, routers or other components, or connections to such components, as well as any other systems associated with providing electrical power or network connectivity to any various sensors provided therein. Additionally, because power or networking equipment or components naturally generate heat during operation, e.g., by resistive heating (or Joule heating or Ohmic heating), spaces in which power or networking equipment are provided must be maintained at selected temperatures or within designated temperature bands, as well as in accordance with various standards of humidity, pressure, purity or other conditions.

DETAILED DESCRIPTION

As is set forth in greater detail below, the present disclosure is directed to modular distribution frames or assemblies, including but not limited to frames or assemblies for housing or maintaining power supplies or conductors, network cards, switches or routers, or any other equipment that may be desired or required in order to provide electrical or communications services at various locations. More specifically, the systems and methods of the present disclosure are directed to frames or assemblies that are modular in nature, and may be utilized individually, or may be readily combined and assembled together, to form spaces for housing or maintaining power or networking equipment on a scalable, as-needed basis. In some implementations, the frames or assemblies may be formed from steel or other materials, and may be mounted to or installed on any horizontal or vertical surfaces, such as walls or floors, or surfaces that are aligned at any other angle, within any type or form of facility. Additionally, the frames or assemblies of the present disclosure may be configured with doors or other operable portals that enable the frames or assemblies to be accessed for installing components therein, or for making connections with or performing maintenance upon any number of such components.

Referring to FIGS. 1A through 1D, components of a modular distribution assembly 110 of the present disclosure are shown. The modular distribution assembly (or "assembly") 110 includes a modular distribution frame (or "frame") 120. The frame 120 is formed from a pair of side panels 122 and a pair of end doors 124. The side panels 122 are aligned in parallel with one another, and have substantially equal lengths and heights. The end doors 124 are also aligned substantially parallel to one another, and have substantially equal lengths and heights.

Figure 1A:
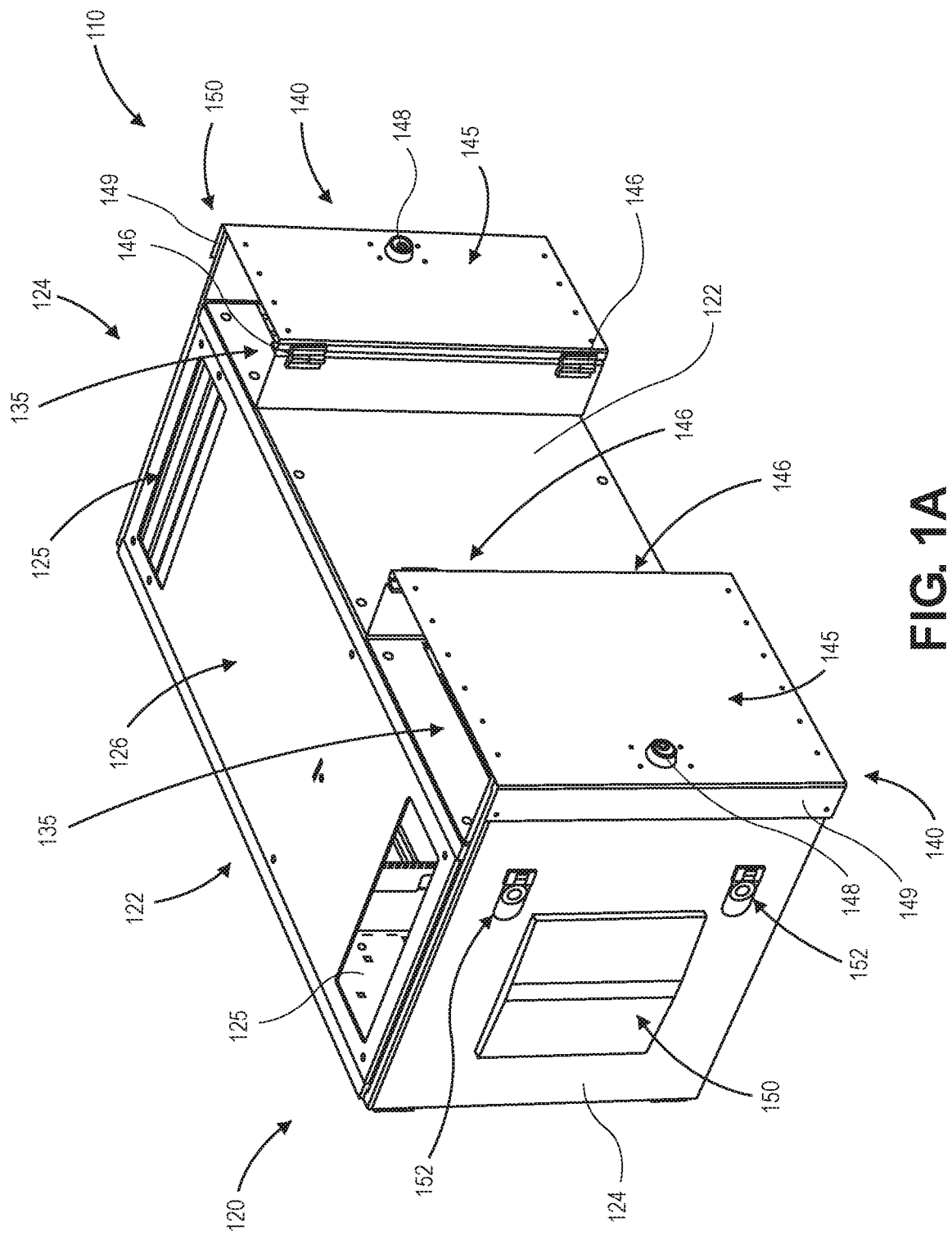
FIGS. 1A through 1D are views of components of one modular distribution assembly in accordance with implementations of the present disclosure.
Figure 1B:
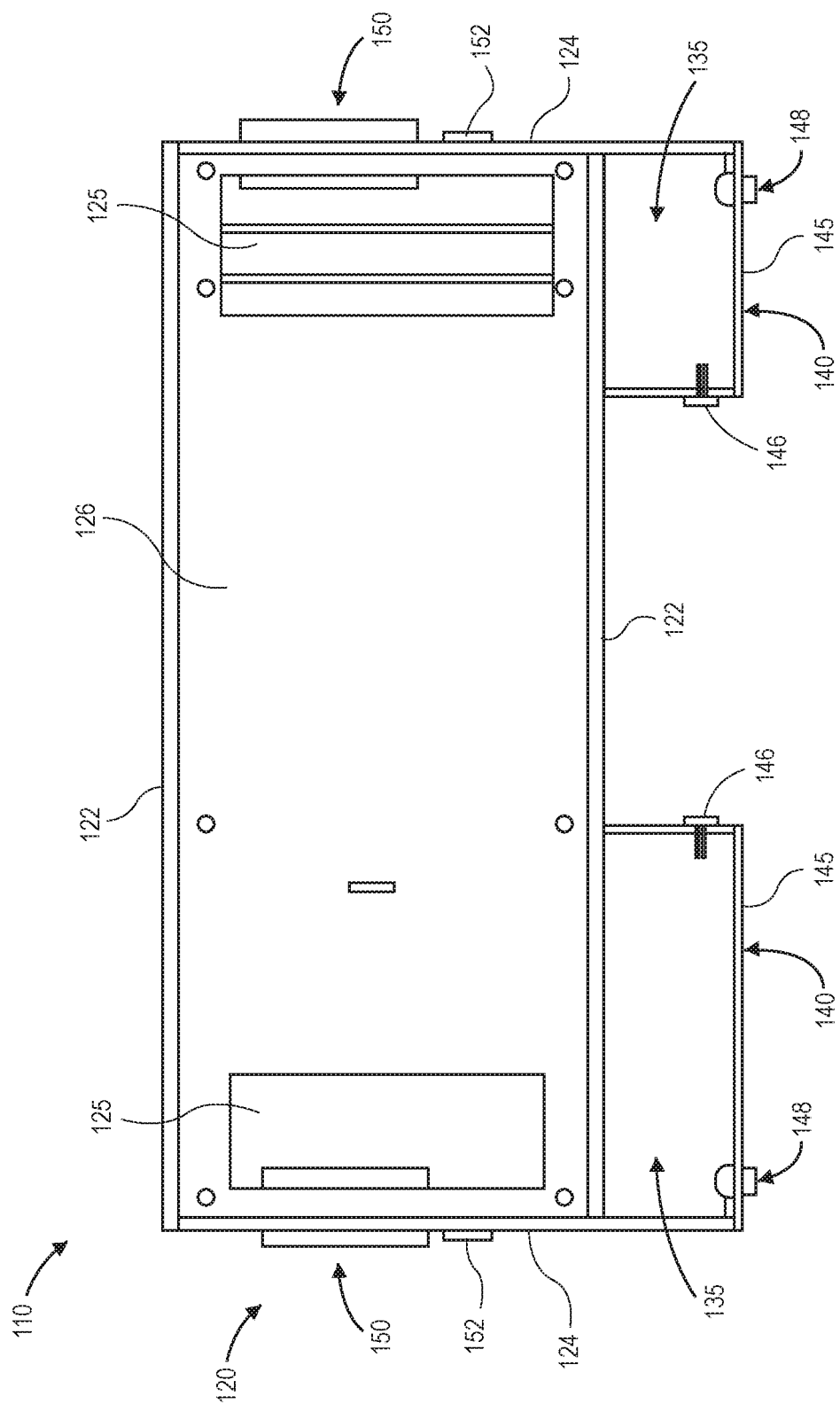
Figure 1C:
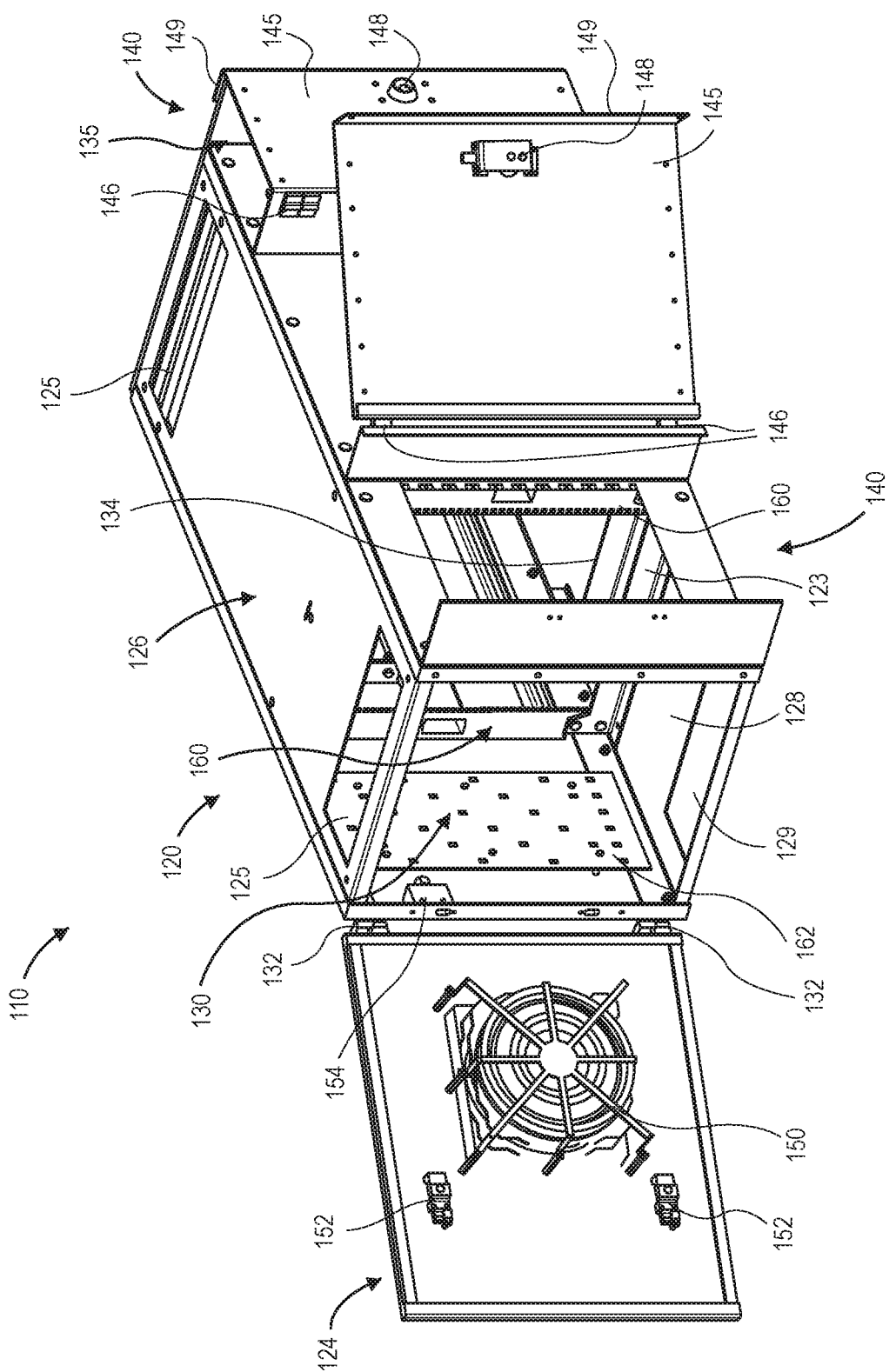
Figure 1D:
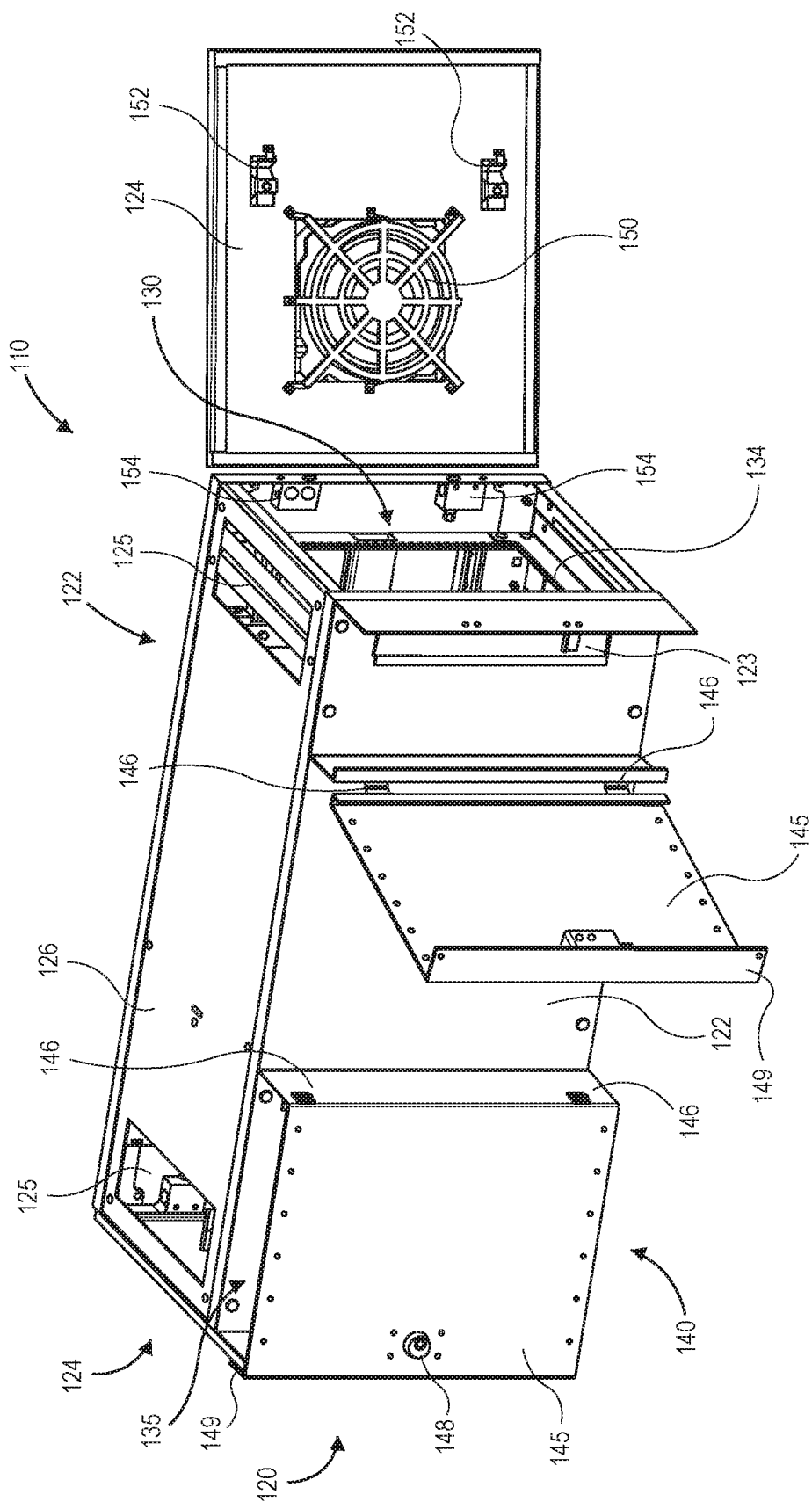

As is shown in FIGS. 1A through 1D, the lengths of the side panels 122 are greater than the lengths of the end doors 124. As is also shown in FIGS. 1A through 1D, the heights of the side panels 122 are substantially equal to the heights of the end doors 124. Additionally, in the implementation of the modular distribution assembly 110 shown in FIGS. 1A through 1D, the side panels 122 and the end doors 124 are aligned substantially vertically, and thus define a cavity 130 or a space having a substantially rectangular cross-section in a vertical direction. Alternatively, the frame 120 may have a cross-section of any shape or area. Each of the end doors 124 is joined to at least one of the side panels 122 by one or more hinges 132, either directly or by one or more frames, such that each of the end doors 124 may be independently opened or closed with respect to the cavity 130 by rotating the end doors 124 about their respective hinges 132, such as is shown in FIGS. 1C and 1D. For example, in some implementations, the hinges 132 may include a pair of leaves or other portions, with one of such leaves or portions mounted to one of the end doors 124, and one of such leaves or portions mounted to one of the side panels, and with a hinge pin inserted within such leaves or portions to rotatably or pivotably join the one of the end doors 124 to the one of the side panels 122.

As is shown in FIGS. 1A through 1D, the assembly 110 further includes a top panel 126 and a bottom panel 128. Each of the top panel 126 and the bottom panel 128 is substantially rectangular, and has an area corresponding to the cross-section of the cavity 130 formed by the frame 120. Additionally, as is further shown in FIGS. 1A and 1B, the top panel 126 includes a pair of openings 125, e.g., for ventilation or for any other purpose. The openings 125 in the top panel 126 may be entirely open or unobstructed, or partially open or obstructed. For example, the openings 125 may further include one or more fans, vents or louvers, or any other components.

As is further shown in FIGS. 1A through 1D, the assembly 110 further includes a pair of access boxes 140 mounted to one of the side panels 122. The access boxes 140 are mounted to the side panels 122 over corresponding openings 123 within the one of the side panels 122, and form a pair of respective cavities 135 that are provided over or adjacent to such openings 123 within the side panels 122. For example, as is shown in FIGS. 1A through 1D, each of the access boxes 140 is defined by a plurality of panels and is joined to the one of the side panels 122. Each of the access boxes 140 may have an opening that corresponds to and is coaligned with one of the openings 123 within the side panels 122.

In some implementations, the access boxes 140 may be mounted to the one of the side panels 122 by one or more screws, bolts, rivets, nails or other like fasteners. For example, in some implementations, the access boxes 140 may be mounted to one of the side panels 122 by a plurality of carriage bolts or other rounded or headless bolts that may be reverse-facing to ensure that those who access a cavity 135 within a given access box 140 may not pry or otherwise remove the access box 140 from the one of the side panels 122 to which the access box 140 is joined. In some other implementations, the access boxes 140 may be mounted to belts, straps, bands, clamps, clips or any other tension or compression members, e.g., any number of glues, straps, or other adhesives. Sizes and/or shapes of the openings 123 within the side panels 122 may be selected on any basis, including but not limited to types or forms of power or network components that are intended for installation or use within the assembly 110 within a vicinity of such openings 123. Similarly, sizes and/or shapes of the access boxes 140 mounted to the side panels 122 may be selected on any basis, including but not limited to sizes or shapes of the openings 123 over which the access boxes 140 are to be mounted.

The access boxes 140 perform a number of different functions in accordance with implementations of the present disclosure, and provide many advantages over existing systems for providing power or network connections. For example, by installing the access boxes 140 external to the cavity 130, the assembly 110 may accommodate a significantly greater density of cables, connectors or other components. Additionally, by installing the access boxes 140 external to the cavity 130, a first end of a cable or connector may be coupled to a component within the cavity 130, and the cable or connector may be extended into one of the cavities 135 defined by one of the access boxes 140, and vertically upward or downward within the one of the cavities 135. The cable or connector may be further extended out of the one of the cavities at a desired location, and a second end of the cable or connector may be mated with one or more components external to the access box 140.

As is shown in FIGS. 1A through 1D, the access boxes 140 include access doors 145 that are mounted to the access boxes 140 via hinges 146 and may be opened or closed to enable or restrict access to the cavity 130, e.g., in a lateral direction, through openings within such access boxes, and through the openings 123 within the side panels 122. The access doors 145 also include locks 148 or other apparatuses which may be operated (e.g., locked or unlocked) via a key or other hardware to enable or restrict access to the cavity 130 defined by the frame 120 via the cavities 135 of the access boxes 145. In some implementations, the locks 148 may be configured for operation electronically, e.g., by one or more wired or wireless connections, such as a keypad or a wireless transceiver operating according to any wireless standard or protocol (e.g., Bluetooth®, Wireless Fidelity or "Wi-Fi," or near-field communication). Furthermore, in some implementations, each of the locks 148 may be configured for operation by different individuals or entities (e.g., workers). For example, each of the locks 148 may be operated by a different key or other hardware, or by different electronic means or techniques (e.g., different passwords or identification numbers). Although the access doors 145 shown in FIGS. 1A through 1D are provided on faces of the access boxes 140 that are parallel to the side panels 122 to which the access boxes 140 are joined, those of ordinary skill in the pertinent arts will recognize that the systems and methods disclosed herein are not limited, and that the access boxes 140 may include access doors 145 that are provided on any faces thereof in accordance with the present disclosure.

One or more components of the assembly 110, including but not limited to one or more components of the frame 120 or the access boxes 140 may be sized, shaped or configured to accommodate any number of power supply cables or network cables. For example, in some other implementations, the assembly 110 may be sized, shaped or configured to accommodate any type of power cables or connectors, including not only low-voltage cables having any number of cores and any type of insulation, but also cables having standard or nominal voltage capacities, e.g., one hundred ten volt (110 V) or two hundred twenty volt (220 V) cables. Such cables may be grounded or ungrounded, and may feature plugs and/or sockets having any number of pins, voltage ratings or current ratings. In some implementations, the assembly 110 may be sized, shaped or configured to accommodate any type of network communications cables, such as Ethernet cables, including but not limited to Category 3, Category 5, Category 5e, Category 6, Category 6a or Category 7 cables, which may be unshielded twisted pair cables, shielded twisted pair cables, or any other type or form of cables. In some implementations, one or more components of the assembly 110 may also be sized, shaped and configured to accommodate audio or video cables, including but not limited to telephone cables, fiber optic cables, speaker wires (of any gauge or length), RCA cables, F-pin cables, S-video cables, Y/C-cables, coaxial cables, Digital Visual Interface (or "DVI") cables, High Definition Multimedia Interface (or "HDMI") cables, or others.

In some embodiments, one of the access boxes 140 may be provided for the purpose of receiving cables supplying electrical power at standard or nominal voltage capacities, e.g., one hundred ten volts (110 V) or two hundred twenty volts (220 V). Such cables may enter the cavity 130 via one of the cavities 135 defined by the one of the access boxes 140, and be connected with a transformer, a switch or another component therein. In some embodiments, another of the access boxes 140 may be provided for the purpose of distributing power at low voltages (e.g., Power over Ethernet) to one or more components, e.g., via cables that are connected with the transformer, the switch or another component within the cavity 130, and extend out of the cavity 130 to connect with one or more other components. The access boxes 140 may be independently utilized for receiving a supply of electrical power or a network connection of any type or form, and distributing the electrical power or network connectivity in the same type or form, or in any other type or form, to one or more external components via another of the access boxes 140 in accordance with embodiments of the present disclosure.

As is shown in FIGS. 1A through 1D, the top panel 126 substantially covers the cavity 130 defined by the frame 120, and does not cover either of the cavities 135 defined by either of the access boxes 140. Alternatively, in some implementations, the top panel 126 may also cover all or portions of either or both of the cavities 135 defined by the respective access boxes 140. Moreover, to the extent that the top panel 126 or another object covers such cavities 135, the top panel 126 may include one or more tubes, pipes, channels or other openings enabling one or more cables, connectors and/or fluid flow to pass therethrough. Although the top panel 126 and the bottom panel 128 are shown as single, contiguous units, in some implementations, either or both of the top panel 126 or the bottom panel 128 may consist of a plurality of panels, such that any number of panels may overlie or underlie portions of the cavity 130.

Additionally, although each of the access boxes 140 is joined to one of the side panels 122 shown in FIGS. 1A through 1D, those of ordinary skill in the pertinent arts will recognize that the access boxes 140 may be joined to either of the side panels 122 in accordance with implementations of the present disclosure, e.g., on either or both sides of the frame 120. Likewise, although the assembly 110 includes two access boxes 140 that are joined to the frame 120, the assemblies of the present disclosure may include any number of the access boxes 140, and such access boxes 140 may be joined to any surface of the frame 120.

In some implementations, the frame 120 may be modular in nature, such that two or more of the frames 120 may be stacked atop one another to expand the size of the cavity 130 therein, e.g., in a vertical direction. In such implementations, the assembly 110 may have a nominal size or volume defined by the numbers of the frames 120 that are aligned horizontally, e.g., multiples of the size or volume of the cavity 130 of a single frame 120. For example, in some implementations, the top panel 126 may be placed atop an upper-most frame 120, and the bottom panel 128 may be installed below a lower-most frame 120. Furthermore, in some implementations in which the assembly 110 includes a plurality of the frames 120, e.g., aligned in a stack, one or more cables may enter the cavity 130 via one or more openings in the top panel 126, e.g., into an uppermost one of the frames 120, or via one or more openings in the bottom panel 128, e.g., into a lowermost one of the frames 120.

Similarly, where two or more of the frames 120 are stacked atop one another, the cavities 135 formed by the respective access boxes 140 may also have nominal sizes or volumes defined by the numbers of the frames 120, e.g., multiples of the sizes or volumes of the cavities 135 of single access boxes 140. Additionally, in some implementations, where an assembly includes two or more of the frames 120, the access doors 145 of the access boxes 140 that are vertically coaligned with one another may be joined together, such that the access doors 145 may be operated in concert with one another. In such implementations, e.g., where two or more access doors 145 are joined together, the access doors 145 may be secured by a single lock 148 or other apparatus.

Alternatively, in some implementations, the assembly 110 may include two or more of the frames 120 that are aligned adjacent to one another, e.g., in a horizontal direction, or back-to-back. For example, where the assembly 110 includes two of the frames 120 that are aligned adjacent to one another, the frames 120 may define a pair of respective cavities 130 therein. Alternatively, however, the frames 120 may define a single cavity 130, e.g., by removing any of the side walls 122 that are in contact with one another while maintaining the side walls 122 that are not in contact with one another or otherwise define a perimeter of the assembly 110. As is discussed above, in such implementations, the assembly 110 may have a nominal size or volume defined by the numbers of the frames 120 that are aligned vertically, e.g., multiples of the size or volume of the cavity 130 of a single frame 120.

Furthermore, in some implementations, the assembly 110 may include a plurality of frames 120 that are aligned in one or more stacks that are placed adjacent to one another.

Moreover, as is shown in FIGS. 1C and 1D, the bottom panel 128 includes openings 129 having sizes, shapes and locations in common with the openings 125 provided in the top panel 126, such that the top panel 126 of one frame 120 may act as a bottom panel 128 to another frame 120, or vice versa. Likewise, where the top panel 126 and the bottom panel 128 have sizes in common with one another, two of the assemblies 110 may be stacked atop one another, such that the openings 125 in a top panel 126 of one assembly 110 may be coaligned with the openings in a bottom panel 128 of another assembly 110, enabling cables, connectors and/or fluid flow to freely pass therebetween.

Various components of the assembly 110, including but not limited to the side panels 122, the end doors 124, the top panel 126, the bottom panel 128, or the access boxes 140, may be formed from any suitable materials and in any manner. For example, in some implementations, components of the assembly 110 may be formed from steel of any thickness or gauge, e.g., fourteen-gauge steel, or steel having a thickness within a range of approximately 0.050 to 0.100 inches, which may be anodized or otherwise treated in any manner. In some other implementations, components of the assembly 110 may be formed from aluminum or aluminum alloys, e.g., aluminum 6063 (or A6063), or from metals other than aluminum, and having any thickness. In some other implementations, the frames may be formed from plastics (e.g., thermosetting plastics such as epoxy or phenolic resins, polyurethanes or polyesters, as well as polyethylenes, polypropylenes or polyvinyl chlorides), wood (e.g., woods with sufficient strength properties such as ash), composites or any other combinations of materials. The components of the assembly 110 may be formed by extrusion (e.g., hot or cold), rolling, forging, drawing, bending or shearing, or any other processes.

Additionally, as is further shown in FIGS. 1A through 1D, the end doors 124 of the frame 120 each include a fan 150 for initiating or securing fluid flow through the cavity 130 defined by the frame 130, e.g., air flow for providing forced convective heat transfer across one or more components within the cavity 130, through the cavity 130 defined by the frame 120. In some implementations, the assembly 110 or the frame 120 may include any number of fans 150, e.g., one, or three or more. Alternatively, or additionally, in some implementations, the assembly 110 or the frame 120 may further include any number of louvers or other openings that permit fluid flow through the cavity 130 while restricting or inhibiting access to the cavity 130. For example, the assembly 110 shown in FIGS. 1A through 1D includes a pair of fans 150, in some implementations, the assembly 110 may include a single fan 150, e.g., in one of the end doors 124, and a louver or another opening, e.g., in another of the end doors 124. In such embodiments, the fan 150 in the one of the end doors 124 may draw air or other fluid flow into the frame 120 through the louvers or other openings in the other of the end doors 124, across any of the components within the cavity 130, and out of the frame 120 via the fan 150. Alternatively, the fan 150 in the one of the end doors 124 may force air or other fluid flow into the frame 120 and across the components within the cavity 130, and out of the frame 120 via the louvers or other openings in the other of the end doors 124.

Moreover, in lieu of or in addition to the fan 150 or any other louvers or other openings, the assembly 110 may be configured to receive chilled air into the cavity 130 from an air conditioner unit or another source, and to discharge air warmed by resistive heat within the cavity 130 therefrom. Furthermore, in some other implementations, the assembly 110 need not include any systems for enabling heat transfer from the cavity 130. For example, where the assembly 110 is operated in a low-temperature environment, a low-pressure environment, or in an environment of varying humidity or moisture levels, the assembly 110 may be sealed or protected against the environment, e.g., by one or more gaskets or other seals. The assembly 110 may thus be operated or utilized in any environment, and at any temperatures, pressures or moisture or humidity levels.

The frame 120 may have any dimensions in accordance with the present disclosure. For example, in some implementations, the frame 120 may have a length of approximately sixty inches (60"), a width of approximately thirty inches (30") and a height of approximately twenty-five inches (25"). Alternatively, the frame 120 may have any other dimensions, e.g., lengths, widths or heights, that may be selected on any basis in accordance with the present disclosure, including but not limited to one or more requirements of the power or networking components to be maintained within the frame 130, or any intended uses of the assembly 110 in general, or of the power or networking components maintained therein in particular.

As is also shown in FIGS. 1C and 1D, the assembly 110 further includes one or more latches 152 and one or more switches 154 associated with the operation of the end doors 124. In some implementations, the latches 152 may be configured for one or more snap-fit connections with one of the side panels 122 or one of the access boxes 140, to releasably secure the end doors 124 in a closed position. Additionally, in some implementations, such as is shown in FIGS. 1A through 1D, the access doors 145 of the access boxes 140 may have edges or extensions 149 that are configured to fold around free edges (e.g., edges that do not include the hinges 132) of the end doors 124 when the end doors 124 are in a closed position, and when the access doors 145 are in a closed position. Therefore, in such implementations, access to the cavity 130 may be secured by placing each of the end doors 124 in a closed position, and by locking the access doors 145 in a closed position by the respective locks 148. The extensions 149 thus reduce a likelihood or level of risk that one may surreptitiously attempt to access the cavity 130 by prying open either of the end doors 124, e.g., using a screwdriver or like device, at either of the free edges. Access to the cavity 130 may be enabled by unlocking one or both of the access doors 145, and opening either of the access doors 145 or, alternatively, by opening either of the access doors 145 and one or both of the end doors 124.

In some implementations, one or more of the switches 154 may be coupled to or associated with the fans 150, e.g., to act as an operational interlock, such that the fans 150 may only be operated when the end doors 124 are closed and secured in place, and may not be operated when the end doors 124 are open, or are not closed and secured in place. In some other implementations, one or more of the switches 154 may generate or transmit one or more signals (e.g., alarm signals or status identification signals) to one or more external computer devices or systems when either of the end doors 124 are operated, e.g., by either opening or closing the end doors 124, such as is shown in FIGS. 1C and 1D. In still other implementations, one or more of the switches 154 may activate a light (e.g., a light-emitting diode or any other light source) within the cavity when either of the end doors 124 are opened, and deactivate the light when both of the end doors 124 are closed, in a manner similar to a standard refrigerator. The switches 154 may be coupled to any systems that are provided external to the assembly 110, or are otherwise associated with the assembly 110 (e.g., located within the cavity 130) in accordance with implementations of the present disclosure.

The assembly 110 further includes a number of structural features within the cavity 130 for supporting any number of power or network components therein. For example, as is shown in FIGS. 1C and 1D, the assembly 110 also includes routings 160 that are mounted to either of the side panels 122 and include one or more ducts or channels that permit cabling to pass from one end of the cavity 130 to another end of the cavity 130. Such ducts or channels may be sized, shaped or otherwise configured to receive any number of connections to power or communications systems within or external to the cavity 130, e.g., cables or other connectors that are coupled to such power or communications systems. The routings 160 may be aligned to form channels within the frame 120, such that a cable may be extended from a jack, a socket, a port or another module of a cable carrier into such channels, and may further include cable guides that are aligned to provide support for cables extending from cable carriers into such channels.

Likewise, the assembly 110 also includes a management board 162 for mounting cables, connectors or other power or network components, e.g., to a face of one of the side panels 122, either directly or by way of one or more clips, ties or other components. The management board 162 may include any number of mounting components for securing cables or connectors, or one or more jacks, sockets, ports or modules, e.g., a patch panel or like system, within the cavity 130. In some implementations, such components may be mounted, aligned or configured within the cavity 130 to permit easy access thereto, e.g., by way of either of the access boxes 140 or the end doors 124.

The routings 160 or the management board 162 may be mounted to the side panels 122 or other components of the frame 120 using rivets, bolts, nails or other like fasteners or, alternatively, straps, bands, clamps, clips, glues or other adhesives. The assembly 110 also includes one or more racks 134 or other structural features joining the routings 160 or the side panels 122 within the cavity 130. For example, the racks 134 may provide support for any number of sets of cables, transformers, power strips or boxes, network interface cards, network switches, routers, modems or other systems within the cavity 130.

Figure 2:
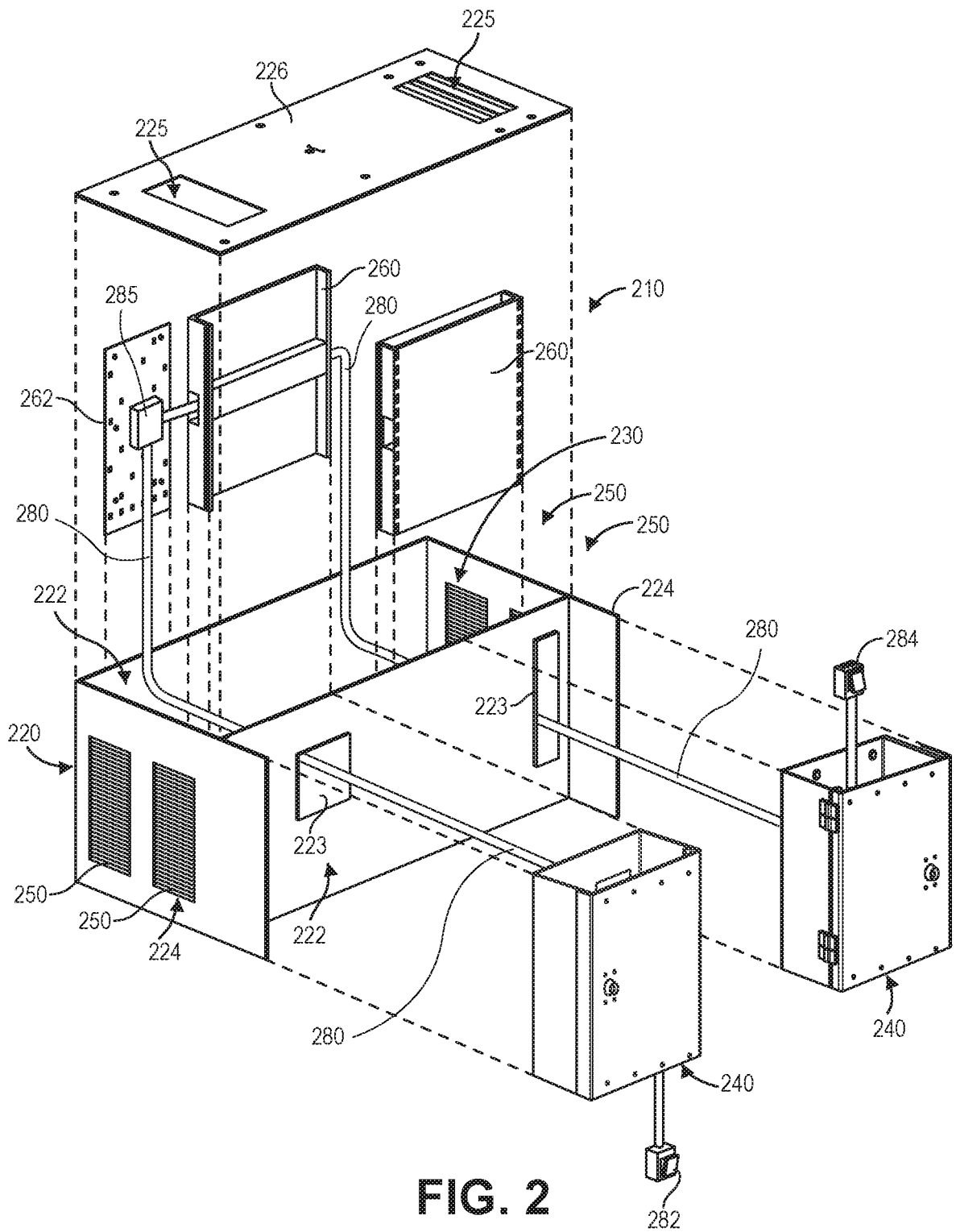
FIG. 2 is a view of components of one modular distribution assembly in accordance with implementations of the present disclosure.

Referring to FIG. 2, components of a modular distribution assembly 210 of the present disclosure are shown. Except where otherwise noted, reference numerals preceded by the number "2" shown in FIG. 2 indicate components or features that are similar to components or features having reference numerals preceded by the number "1" shown in FIGS. 1A through 1D.

As is shown in FIG. 2, the assembly 210 comprises a frame 220, a top panel 226 and a pair of access boxes 240. The various components of the frame 220 shown in FIG. 2 are similar to the corresponding components of the frame 120 shown in FIGS. 1A through 1D.

The frame 220 is formed from a pair of side panels 222 and a pair of end doors 224, which may be joined to one another to define a cavity 230 therein. The side panels 222 are aligned in parallel with one another, and have substantially equal lengths and heights, while the end doors 224 are also aligned substantially parallel to one another, and also have substantially equal lengths and heights. The lengths of the side panels 222 are greater than the lengths of the end doors 224, while the heights of the side panels 222 are substantially equal to the heights of the end doors 224.

One of the side panels 222 includes a pair of rectangularly shaped openings 223, and a pair of access boxes 240 mounted over the openings 223. Additionally, the end doors 224 each include sets of vents 250 or other openings enabling fluid flow, e.g., air flow for providing forced convective heat transfer across one or more components within the cavity 230, into the frame 220.

Additionally, within the cavity 230, the frame 220 further includes a pair of routings 260 that are mounted to either of the side panels 222 and include one or more ducts or channels that permit cabling to pass from one end of the cavity 230 to another end of the cavity 230. Likewise, the frame 220 further includes a management board 262 to which cables, connectors or other power or network components may be mounted, e.g., to a face of one of the side panels 222, either directly or by way of one or more clips, ties or other components. The frame 220 may also include one or more racks or other structural features (not shown) for joining the routings 260 or the side panels 220 within the cavity 230, or for providing support for any number of sets of cables, transformers, power strips or boxes, network interface cards, network switches, routers, modems or other systems within the cavity 230.

In accordance with implementations of the present disclosure, modular distribution assemblies, including but not limited to the assembly 210, may be used to provide a secure housing for power or network connections to or between any number of external or internal components. For example, as is shown in FIG. 2, one or more cables 280 may be extended into and out of the assembly 210 via the access boxes 240. A first end 282 of a cable 280 may be made available for mating with one or more power sources or network hubs, or any other relevant systems. The cable 280 may enter one of the access boxes 240, e.g., from above or below a cavity defined by the one of the access boxes 240, and may pass through a pair of corresponding openings in the one of the access boxes 240 and one of the side panels 222 to which the one of the access boxes 240 is mounted before entering the cavity 230. Within the cavity, the cable 280 may then be connected to a component 285 (e.g., a router, a modem, a transformer, a network switch, a patch panel, or any other relevant component). Another cable 280 connected to the component 285 may then extend through a channel within one of the routings 260 before passing through a pair of corresponding openings in another of the access boxes 240 and one of the side panels 222 to which the other one of the access boxes 240 is mounted before exiting the cavity 230 and entering a cavity defined by the other one of the access boxers 240. The cable 280 may then exit the other one of the access boxes 240, e.g., to above or below a cavity defined by the other of the access boxes 240, and a second end 284 of the cable may be made available for mating with another component requiring power or network connectivity, or any other resources that are associated with the component 285.

Figure 3A:
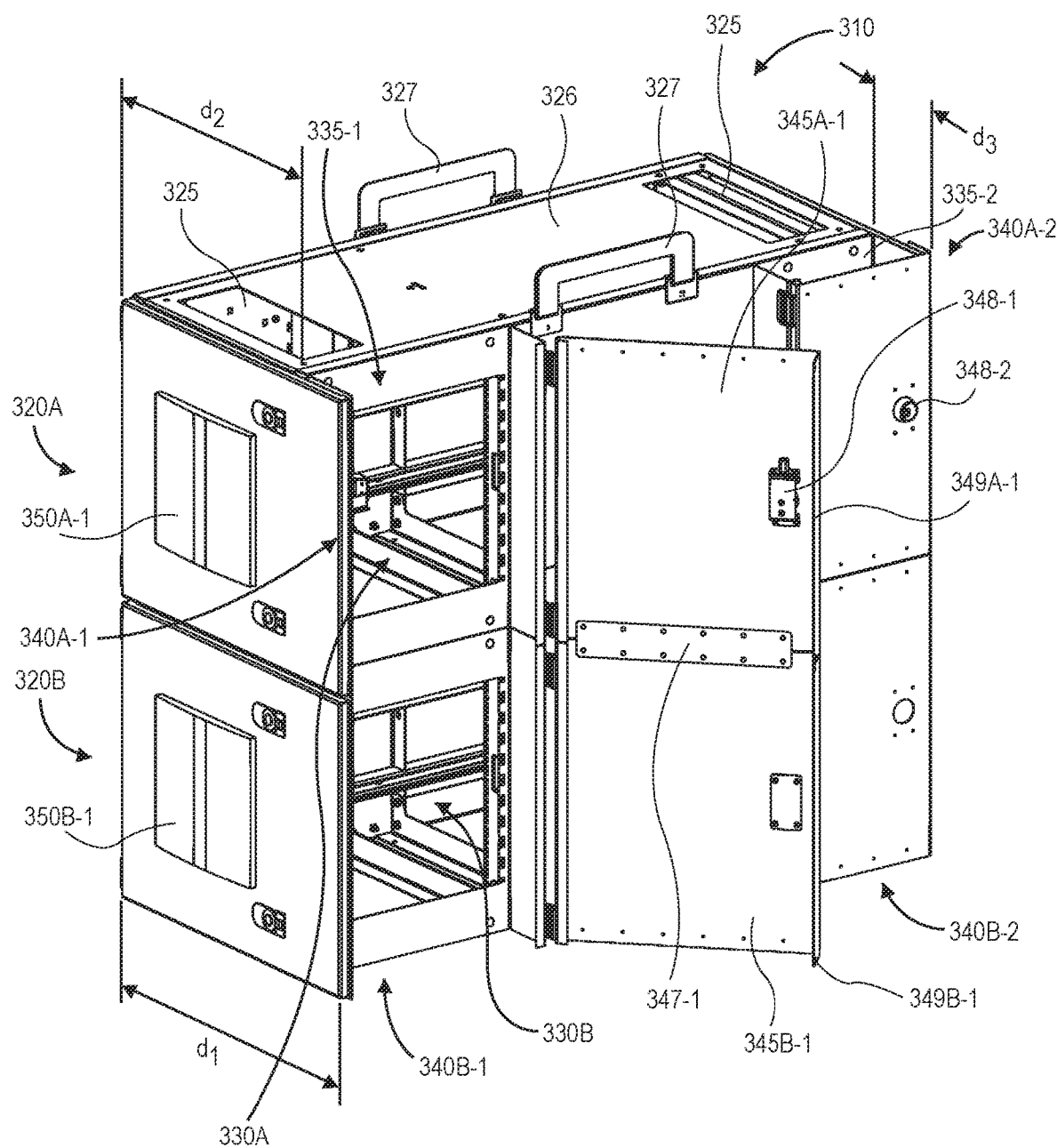
FIGS. 3A and 3B are views of components of one modular distribution assembly in accordance with implementations of the present disclosure.
Figure 3B:
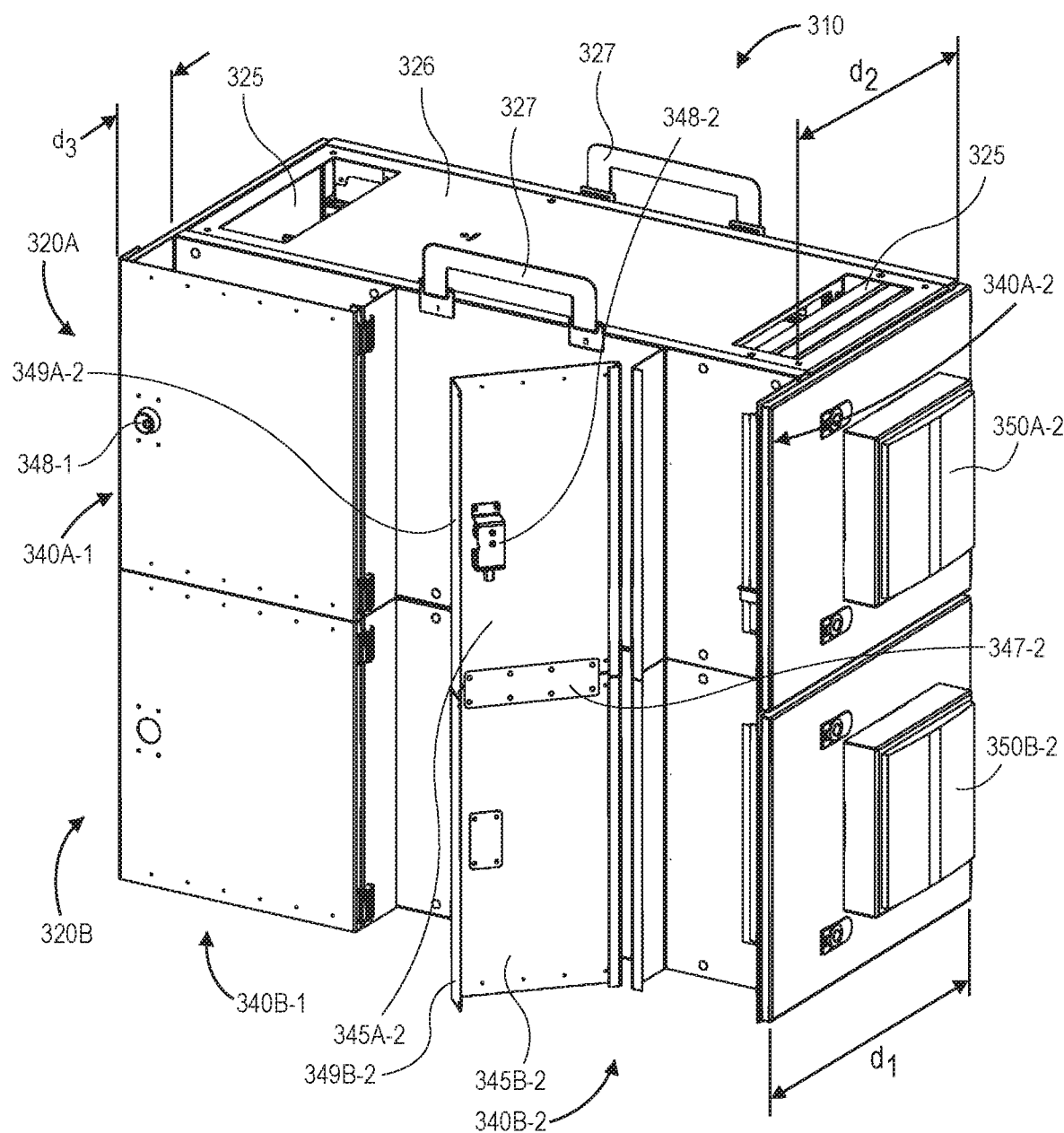

As is discussed above, two or more of the modular distribution frames of the present disclosure may be stacked atop one another to expand a space or volume within which power or network components may be installed or provided. Access to one or more cavities defined by such frames may be controlled by coupling two or more access boxes or access doors to one another, such that access to the cavity may be provided by the operation of a single one of the access doors. Referring to FIGS. 3A and 3B, components of a modular distribution assembly 310 of the present disclosure are shown. Except where otherwise noted, reference numerals preceded by the number "3" shown in FIG. 3A or 3B indicate components or features that are similar to components or features having reference numerals preceded by the number "2" shown in FIG. 2 or by the number "1" shown in FIGS. 1A through 1D.

As is shown in FIGS. 3A and 3B, the assembly 310 includes a pair of modular distribution frames 320A, 320B, and a top panel 326. The various components of the frames 320A, 320B are similar to the corresponding components of the frame 110 shown in FIGS. 1A through 1D or the frame 220 shown in FIG. 2. Each of the frames 320A, 320B includes a pair of side panels and a pair of end doors that define cavities 330A, 330B within the respective frames 320A, 320B. The frames 320A, 320B are stacked atop another, viz., with the frame 320A provided above the frame 320B. The frames 320A, 320B further include pairs of fans 350A-1, 350A-2, 350B-1, 350B-2 mounted in their respective end doors for initiating or securing fluid flow through the cavities 330A, 330B.

As is further shown in FIGS. 3A and 3B, the assembly 310 further includes a pair of access boxes 340A-1, 340A-2 joined to a side panel of the frame 320A, and a pair of access boxes 340B-1, 340B-2 joined to a side panel of the frame 320B. The access boxes 340A-1, 340B-1 are vertically coaligned with respect to one another. The access boxes 340A-2, 340B-2 are vertically coaligned with respect to one another. Each of the access boxes 340A-1, 340A-2 is mounted over a respective opening in one of the side panels of the frame 320A. Each of the access boxes 340B-1, 340B-2 is mounted over a respective opening in one of the side panels of the frame 320B.

The vertical coalignment of the access boxes 340A-1, 340B-1 defines a common cavity 335-1 that extends vertically between the corresponding access boxes 340A-1, 340B-1. Similarly, the vertical coalignment of the access boxes 340A-2, 340B-2 defines a common cavity 335-2 that extends vertically between the corresponding access boxes 340A-2, 340B-2. Additionally, each of the access boxes 340A-1, 340A-2, 340B-1, 340B-2 includes an access door 345A-1, 345A-2, 345B-1, 345B-2 that may be opened to enable access to the cavities 330A, 330B. Each of the access doors 345A-1, 345A-2, 345B-1, 345B-2 includes an angled extension edge or extension 349A-1, 349A-2, 349B-1, 349B-2 that is configured to fold around a free edge of one of the end doors of the frames 320A, 320B when such end doors are in closed positions, and when the corresponding access doors 345A-1, 345A-2, 345B-1, 345B-2 are in closed positions. Therefore, in such implementations, access to the cavities 330A, 330B may be secured by placing each of the end doors of the frames 320A, 320B in closed positions, and by locking the access doors 345A-1, 345A-2, 345B-1, 345B-2 in closed positions.

As is also shown in FIG. 3A, the access doors 345A-1, 345B-1 of the vertically coaligned access boxes 340A-1, 340B-1 are coupled to one another by a joiner 347-1. Accordingly, the access doors 345A-1, 345B-1 may be operated together to permit access to each of the cavities 330A, 330B at ends of their respective frames 320A, 320B, or to inhibit access to such cavities. Additionally, the access door 345A-1 includes a lock 348-1, and the access door 345B-1 does not include any form of lock. Therefore, because the access doors 345A-1, 345B-1 are coupled to one another by the joiner 347-1, the single lock 348-1 in the access door 345A-1 may be operated to secure both of the access doors 345A-1, 345B-1 in a closed position, or to enable both of the access doors 345A-1, 345B-1 to be rotated together to an open position, as is shown in FIG. 3A.

Similarly, as is shown in FIG. 3B, the access doors 345A-2, 345B-2 of the vertically coaligned access boxes 340A-2, 340B-2 are also coupled to one another by a joiner 347-2, such that the access doors 345A-2, 345B-2 may be operated together to permit access to each of the cavities 330A, 330B at ends of their respective frames 320A, 320B, or to inhibit access to such cavities. Likewise, the access door 345A-2 includes a lock 348-2, which may be operated to secure both of the access doors 345A-2, 345B-2 in a closed position, or to enable both of the access doors 345A-2, 345B-2 to be rotated to an open position, as is shown in FIG. 3B. The access door 345B-2 does not include any form of lock.

Alternatively, or additionally, in some implementations, the end doors of the respective frames 320A, 320B may also be coupled to one another, e.g., by a joiner, such as the joiners 347-1, 347-2. In such implementations, the end doors of the respective frames 320A, 320B may be operated together to permit access to each of the cavities 330A, 330B at ends of their respective frames 320A, 320B, or to inhibit access to such cavities.

As is further shown in FIGS. 3A and 3B, a pair of handles 327 are mounted to each of the side panels of the frame 320A, e.g., at upper edges of the side panels, and on either side of the top panel 326. The handles 327 may be formed from any suitable and durable material, including but not limited to plastics, metals, woods, woven or non-woven fabrics, leather, or other like materials, or combinations thereof, and joined to the frame 320A in any manner. Thus, in some implementations, the frame 320A may be placed atop or removed from the frame 320B by way of the handles 327. Alternatively, where the frame 320A is joined to the frame 320B, the assembly 310 may be transported to or placed in a selected location by way of the handles 327, or removed from the selected location by way of the handles 327.

As is also shown in FIGS. 3A and 3B, the end doors of each of the frames 320A, 320B have a width $d_1$, while the cavities 330A, 330B and the top panel 326 have a width $d_2$, and the access boxes 340 have a width $d_3$. The width $d_1$ is approximately equal to a sum of the width $d_2$ and the width $d_3$, such that the end doors extend beyond the side panels of the respective frames 320A, 320B to ends of the access boxes 340. Therefore, as is discussed above, in such implementations, access to the cavities 330A, 330B may be secured by placing each of the end doors in a closed position, and by locking the access doors 345A-1, 345B-1 or the access doors 345A-2, 345B-2 in a closed position by the respective locks 348-1, 348-2. Access to the cavities 330A, 330B may enabled by unlocking the access doors 345A-1, 345B-1 or the access doors 345A-2, 345B-2, and opening either the access doors 345A-1, 345B-1 or the access doors 345A-2, 345B-2, or one or both of the end doors 124.

Figure 4:
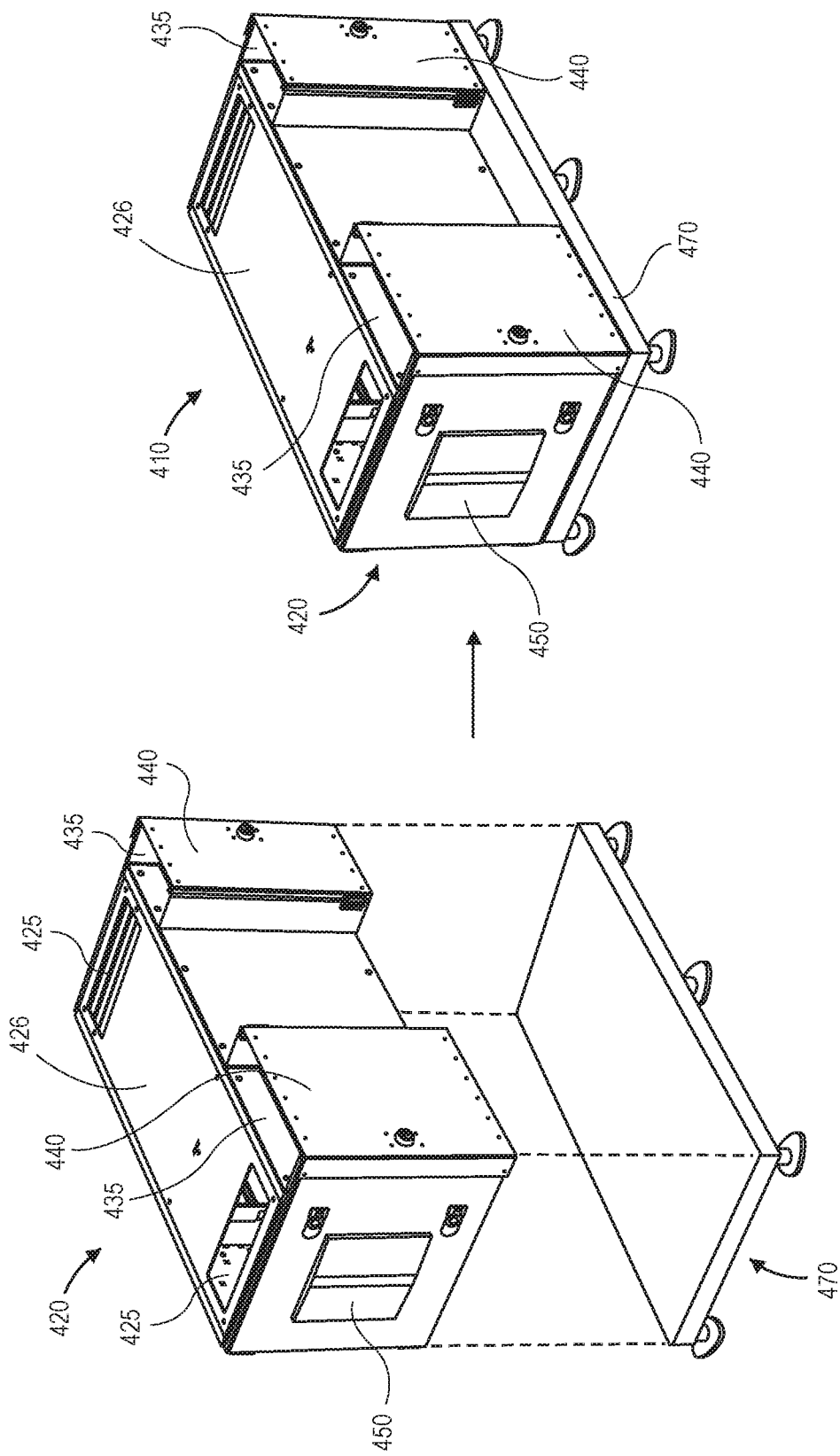
FIG. 4 is a view of components of one modular distribution assembly in accordance with implementations of the present disclosure.

The modular distribution assemblies of the present disclosure may be mounted to any surfaces in accordance with implementations of the present disclosure. Referring to FIG. 4, components of a modular distribution assembly 410 of the present disclosure are shown. Except where otherwise noted, reference numerals preceded by the number "4" shown in FIG. 4 indicate components or features that are similar to components or features having reference numerals preceded by the number "3" shown in FIG. 3A or 3B, by the number "2" shown in FIG. 2 or by the number "1" shown in FIGS. 1A through 1D.

As is shown in FIG. 4, a modular distribution assembly 410 is formed by placing a frame 420 atop a plinth 470. The various components of the frame 420 are similar to the corresponding components of the frame 110 shown in FIGS. 1A through 1D, the frame 220 shown in FIG. 2, or the frames 320A, 320B of FIGS. 3A and 3B.

For example, as is shown in FIG. 4, the frame 420 includes a pair of side panels and a pair of end doors, and defines a cavity (not shown). A top panel 426 placed atop the frame 420 includes a pair of openings 425 for ventilation or for any other purpose. Such openings 425 may be unobstructed or partially obstructed, e.g., by vents, louvers or other objects or components. Additionally, the frame 420 further includes at least one fan 450 mounted within one of the end doors of the frame 420. A pair of access boxes 440 are also mounted to one of the side panels of the frame 420. Each of the access boxes 440 is configured to enable or inhibit access to the cavity defined within the frame 420, e.g., by operation of one or more access doors provided thereon. Additionally, each of the access boxes 440 forms a cavity 435, such that the cavity defined within the frame 420 may be accessed by way of one or both of the cavities 435 of the access boxes 440. As is shown in FIG. 4, the top panel 426 covers the frame 420 and the cavity formed therein, but does not cover the cavities 435 defined by the access boxes 440. Alternatively, in some implementations, the top panel 426 may cover one or both of the cavities defined by the access boxes 440.

The plinth 470 may be a base, a block or another system that may, in some implementations, be specifically designed or constructed to provide structural support to the frame 420 and any components therein. The plinth 470 may rest directly on one or more surfaces, or may have fixed or adjustable legs that may come into contact with such surfaces, in order to provide an even (e.g., substantially planar) and durable support for the frame 420 and any power or network components therein. In some implementations, the plinth 470 may include any number of fixed or adjustable legs, feet or other extensions configured to contact the one or more surfaces. Alternatively, in some implementations, the frame 420 may be placed directly onto a floor or other horizontal surface, or atop one or more other frames.

Additionally, an area of an upper surface of the plinth 470 is at least as large as an area defined by the side panels and the end walls of the frame 420. For example, as is shown in FIG. 4, the plinth 470 is sufficiently large to include the frame 420 and undersides of each of the access boxes 440, which rest on the upper surface of the plinth 470. Alternatively, or additionally, the upper surface of the plinth 470 may have a size and a shape that corresponds to the frame 420, but is not large enough or does not extend beneath the access boxes 440. In some implementations, the plinth 470 or the frame 420 may include one or more gaskets or other seals, e.g., provided at an interface where bottom edges of the side panels or the end doors of the frame 420, or other portions of the frame 420, come into contact with the plinth 470.

Figure 5:
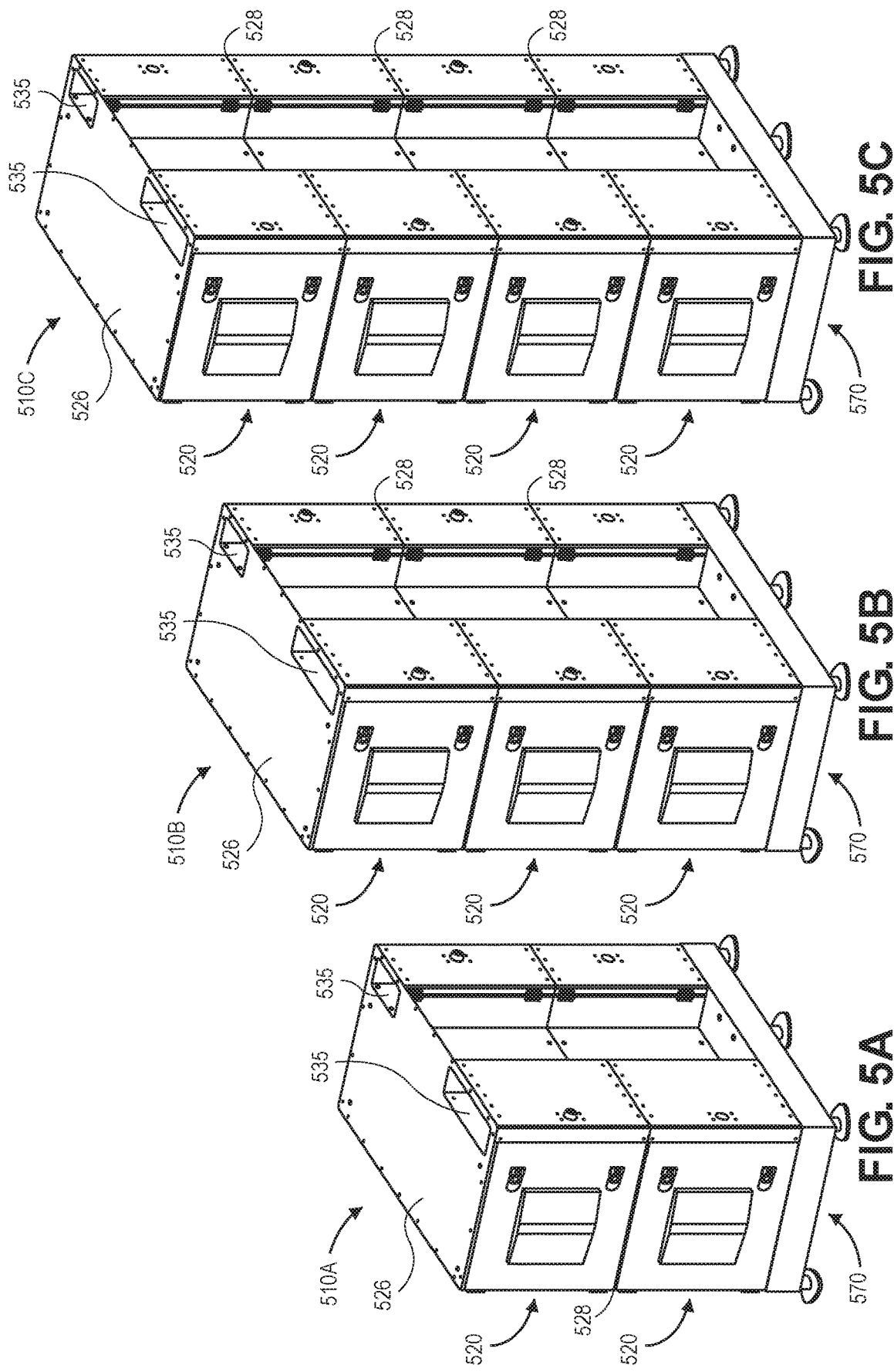
FIGS. 5A through 5C are views of components of modular distribution assemblies in accordance with implementations of the present disclosure.

As is discussed above, the modular distribution frames of the present disclosure are indeed modular in nature, and a modular distribution assembly may include any number of the frames in accordance with implementations of the present disclosure. Referring to FIGS. 5A through 5C, components of modular distribution assemblies 510A, 510B, 510C of the present disclosure are shown. Except where otherwise noted, reference numerals preceded by the number "5" shown in FIGS. 5A through 5C indicate components or features that are similar to components or features having reference numerals preceded by the number "4" shown in FIG. 4, by the number "3" shown in FIG. 3A or 3B, by the number "2" shown in FIG. 2 or by the number "1" shown in FIGS. 1A through 1D.

The various components of the frame 520 of FIGS. 5A through 5C are similar to the corresponding components of the frame 110 shown in FIGS. 1A through 1D, the frame 220 shown in FIG. 2, the frames 320A, 320B of FIGS. 3A and 3B, or the frame 420 of FIG. 4.

As is shown in FIG. 5A, the assembly 510A includes a pair of modular distribution frames 520, a top panel 526, an intervening panel 528 and a plinth 570. The frames 520 rest atop one another, and on the plinth 570. Thus, by stacking the frames 520 atop one another, the assembly 510A may accommodate power or networking components within a cavity formed by the pair of frames 520 that is approximately twice a nominal size of a cavity formed by one of the frames 520 individually. Additionally, the assembly 510A further includes a pair of cavities 535 defined by corresponding pairs of access boxes mounted to side panels of the frames 520, and extending along a height of the assembly 510A. The cavities 535 enable cables, connectors or other components to be run into the cavity formed by the frames 520, through openings within the access boxes and the side panels of the frames 520.

The intervening panel 528 may be provided between the frames 520, and may have substantially the same size and shape as the top panel 526. In some implementations, the assembly 510A may include an intervening panel (not shown) provided between cavities formed within the frames 520. For example, such an intervening panel may have substantially the same size and shape as the top panel 526. Alternatively, in some implementations, the intervening panel 528 may have a different shape or size that is different from a shape or a size of the top panel 526. In still other implementations, the assembly 510A need not include any intervening panels or other components.

The modular distribution assemblies of the present disclosure may include any number of frames. For example, as is shown in FIG. 5B, the assembly 510B includes three of the frames 520 beneath the top panel 526 and resting on the plinth 570, with two intervening panels 528 between the frames 520. The assembly 510B may accommodate power or networking components within a cavity formed by the pair of frames 520 that is approximately three times a nominal size of a cavity formed by one of the frames 520 individually. Additionally, the assembly 510B further includes a pair of cavities 535 defined by corresponding pairs of access boxes mounted to side panels of the frames 520, and extending along a height of the assembly 510B. The cavities 535 enable cables, connectors or other components to be run into the cavity formed by the frames 520, through openings within the access boxes and the side panels of the frames 520.

Likewise, as is shown in FIG. 5C, the assembly 510C includes four of the frames 520 beneath the top panel 526 and resting on the plinth 570, with three intervening panels 528 between the frames 520. The assembly 510C may accommodate power or networking components within a cavity formed by the pair of frames 520 that is approximately four times a nominal size of a cavity formed by one of the frames 520 individually. Additionally, the assembly 510C further includes a pair of cavities 535 defined by corresponding pairs of access boxes mounted to side panels of the frames 520, and extending along a height of the assembly 510C. The cavities 535 enable cables, connectors or other components to be run into the cavity formed by the frames 520, through openings within the access boxes and the side panels of the frames 520.

Figure 6:
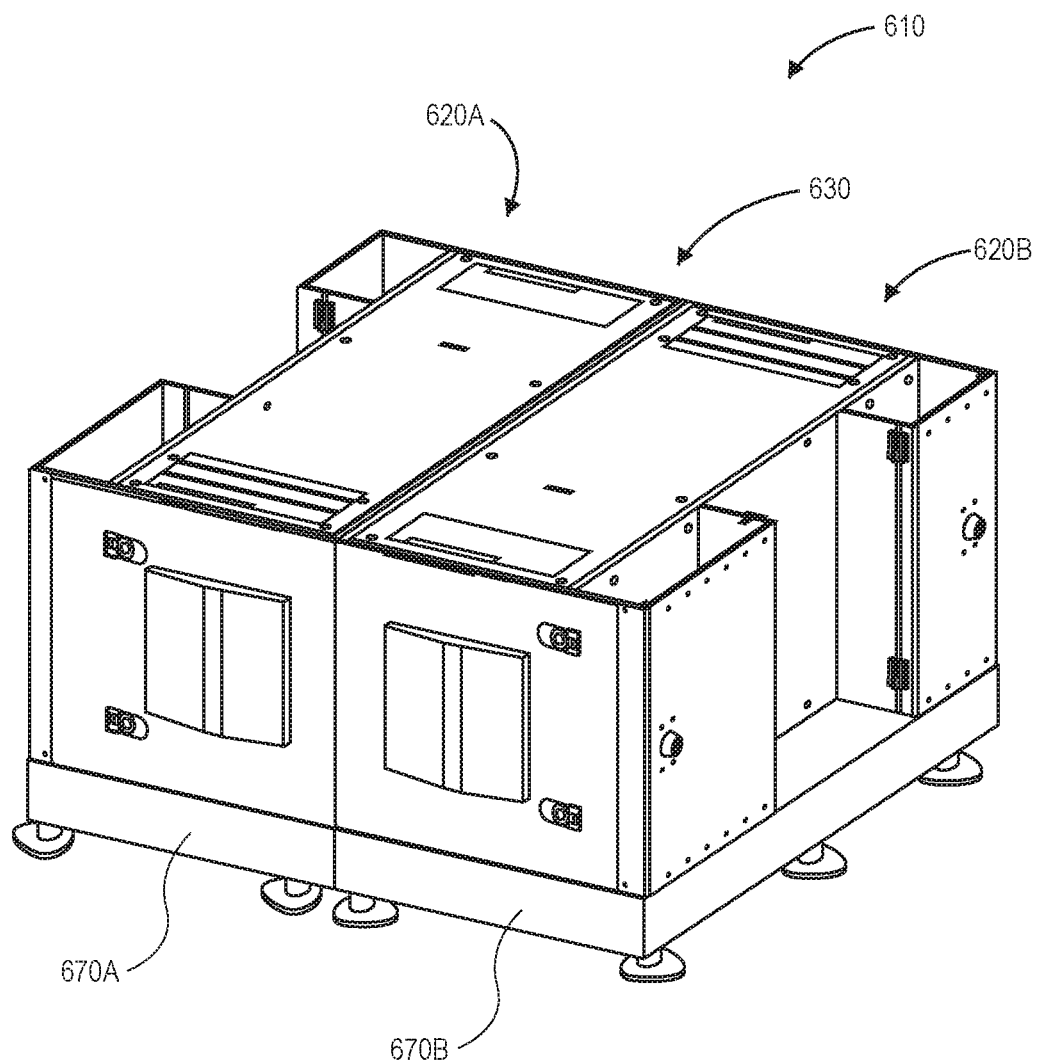
FIG. 6 is a view of components of one modular distribution assembly in accordance with implementations of the present disclosure.

As is discussed above, a modular distribution assembly may include any number of frames that are joined to one another, e.g., in one or more stacks, such as is shown in FIGS. 5A through 5C, or frames that are placed alongside or adjacent to one another. Referring to FIG. 6, components of one modular distribution assembly 610 of the present disclosure are shown. Except where otherwise noted, reference numerals preceded by the number "6" shown in FIG. 6 indicate components or features that are similar to components or features having reference numerals preceded by the number "5" shown in FIGS. 5A through 5C, by the number "4" shown in FIG. 4, by the number "3" shown in FIG. 3A or 3B, by the number "2" shown in FIG. 2 or by the number "1" shown in FIGS. 1A through 1D.

As is shown in FIG. 6, the assembly 610 includes a first frame 620A resting on a first plinth 670A and a second frame 620B resting on a second plinth 670B, with top panels 626A, 626B atop the first frame 620A and the second frame 620B, respectively. The various components of the first frame 620A and the second frame 620B of FIG. 6 may be similar to the corresponding components of the frame 120 shown in FIGS. 1A through 1D, the frame 220 shown in FIG. 2, the frames 320A, 320B of FIGS. 3A and 3B, the frame 420 of FIG. 4 or the frames 520 of FIGS. 5A through 5C.

The first frame 620A and the second frame 620B are aligned adjacent to one another, e.g., back-to-back, and define a cavity 630 therein. Each of the first frame 620A and the second frame 620B includes a pair of access boxes on opposite sides from one another, and pairs of end doors. For example, the cavity 630 may be defined by an interior of the panels of the first frame 620A and the second frame 620B to which the access boxes are mounted, and the respective end doors of the first frame 620A and the second frame 620B. In some implementations, however, each of the first frame 620A and the second frame 620B may include intervening side panels that may divide the cavity 630 into a pair of cavities.

Figure 7:
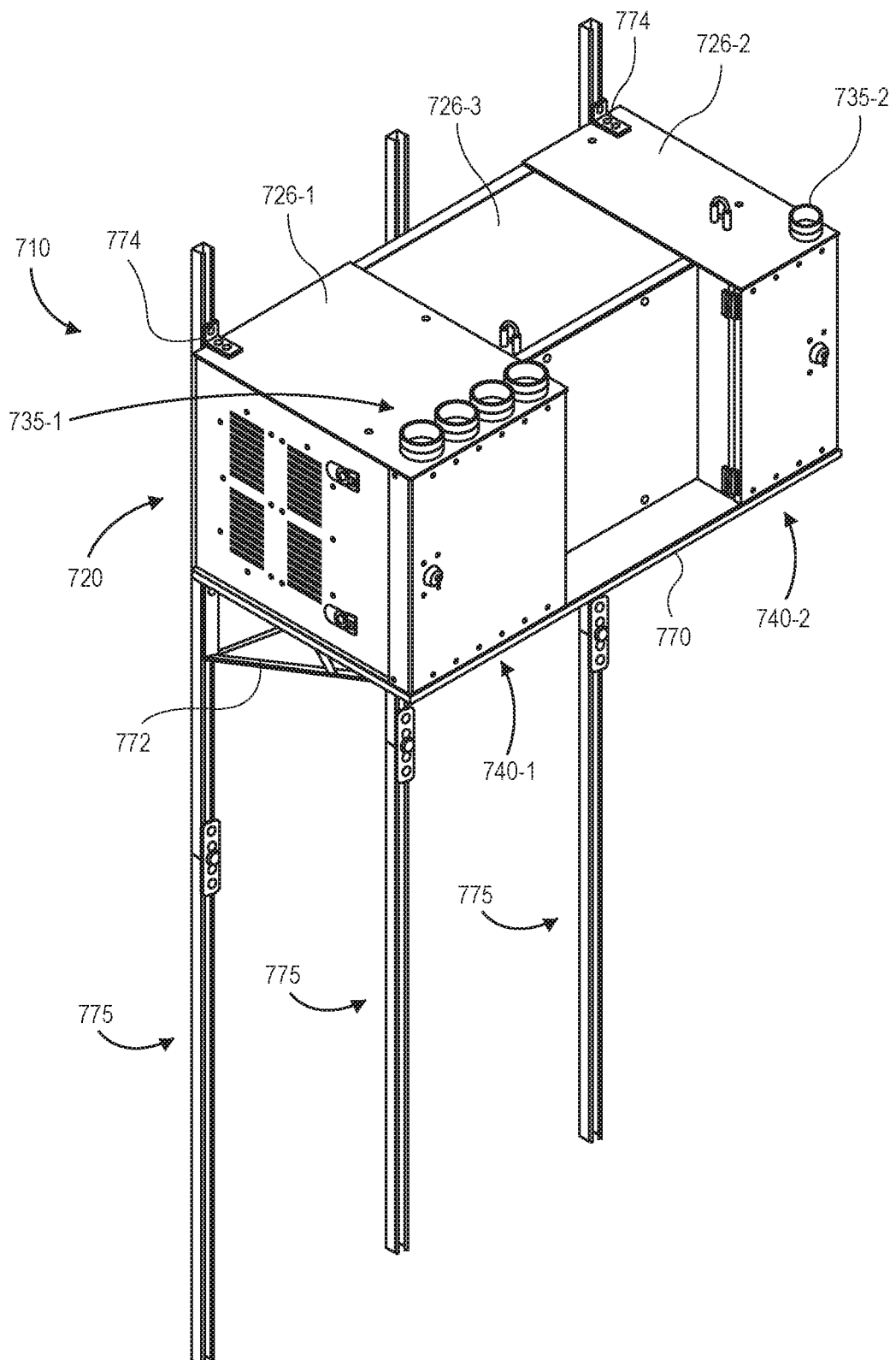
FIG. 7 is a view of components of one modular distribution assembly in accordance with implementations of the present disclosure.

The modular distribution assemblies of the present disclosure may be mounted to any surface. For example, in some implementations, a modular distribution assembly may be mounted to a wall, e.g., by a shelf or other platform. Referring to FIG. 7, components of one modular distribution assembly 710 of the present disclosure are shown. Except where otherwise noted, reference numerals preceded by the number "7" shown in FIG. 7 indicate components or features that are similar to components or features having reference numerals preceded by the number "6" shown in FIG. 6, by the number "5" shown in FIGS. 5A through 5C, by the number "4" shown in FIG. 4, by the number "3" shown in FIG. 3A or 3B, by the number "2" shown in FIG. 2 or by the number "1" shown in FIGS. 1A through 1D.

As is shown in FIG. 7, the assembly 710 includes a modular distribution frame 720, a plurality of top panels 726-1, 726-2, 726-3, a pair of access boxes 740-1, 740-2 and a shelf (or other platform) 770. The various components of the frame 720 of FIG. 7 may be similar to the corresponding components of the frame 120 shown in FIGS. 1A through 1D, the frame 220 shown in FIG. 2, the frames 320A, 320B of FIGS. 3A and 3B, the frame 420 of FIG. 4, the frames 520 of FIGS. 5A through 5C or the frames 620A, 620B of FIG. 6.

The assembly 710 is mounted to a wall or other substantially vertical surface having a plurality of tracks (or other wall mounts) 775. For example, as is shown in FIG. 7, a plurality of brackets 772 are mounted to and extend laterally outward from the tracks 775, and the frame 720 rests on the brackets 772. Additionally, a pair of clips 774 mounted to the tracks 775 are joined to the top panels 726-1, 726-2 or the frame 720. Furthermore, the access boxes 740-1, 740-2 are mounted to a front face of the assembly 710, e.g., to a side panel of the frame 720. Additionally, as is shown in FIG. 7, a plurality of conduits 735-1 extend through the top panel 726-1 and into a cavity defined within the access box 740-1. Additionally, a conduit 735-2 extends through the top panel 726-2 and into a cavity defined within the access box 740-2. The assembly 710 may have any number of the conduits 735-1, 735-2 in accordance with implementations of the present disclosure, and such conduits 735-1, 735-2 may have any dimensions. For example, in some implementations, the conduits 735-1, 735-2 may have any internal diameters, e.g., approximately one-half inch (0.5"), or any other suitable diameters that may accommodate any cables, connectors or other components extending into the access boxes 740-1, 740-2 and a cavity within the frame 720 while also inhibiting access thereto.

The assembly 710 may be mounted at any height and within any space or facility in accordance with implementations of the present disclosure. For example, in some implementations, the shelf 770 may be mounted at a suitably high level to avoid contact with personnel (e.g., heads of such personnel) within such spaces or facilities, e.g., a height of approximately eight feet (8 ft). Additionally, in some implementations, the assembly 710 may be mounted at a sufficiently low level to permit one or more cables, conductors or other components to extend into the access boxes 740-1, 740-2 by way of the conduits 735-1, 735-2.

Although the disclosure has been described herein using exemplary techniques, components, and/or processes for implementing the systems and methods of the present disclosure, it should be understood by those skilled in the art that other techniques, components, and/or processes or other combinations and sequences of the techniques, components, and/or processes described herein may be used or performed that achieve the same function(s) and/or result(s) described herein and which are included within the scope of the present disclosure. For example, although some of the implementations of modular distribution frames or assemblies disclosed herein may be described as intended for use within a fulfillment center or materials handling facility, those of ordinary skill in the pertinent arts will recognize that the frames or assemblies of the present disclosure are not so limited, and may be utilized in association with any systems or facilities for which power, utility, communications or other connections are required, including but not limited to fulfillment centers, materials handling facilities, or other systems or facilities having spaces of limited size that may be provided in any environment or for any purpose.

Moreover, those of ordinary skill in the pertinent arts will further recognize that any type, form or number of the modular distribution frames or assemblies of the present disclosure may be provided singly or in tandem for the purpose of providing power, utility, communications or other connections to any number of components, including but not limited to sensors of any type or form. For example, although some of the implementations disclosed herein include modular distribution assemblies having a single frame, those of ordinary skill in the pertinent arts will recognize that two or more frames may be provided within a modular housing assembly, or that each of such frames may include any number of the components described herein in accordance with the present disclosure.

As is discussed above, used herein, a "materials handling facility" may include, but is not limited to, warehouses, distribution centers, cross-docking facilities, order fulfillment facilities, packaging facilities, shipping facilities, rental facilities, libraries, retail stores or establishments, wholesale stores, museums, or other facilities or combinations of facilities for performing one or more functions of material or inventory handling for any purpose. Likewise, the systems and methods of the present disclosure may also be utilized outside of a traditional materials handling facility environment.

It should be understood that, unless otherwise explicitly or implicitly indicated herein, any of the features, characteristics, alternatives or modifications described regarding a particular implementation herein may also be applied, used, or incorporated with any other implementation described herein, and that the drawings and detailed description of the present disclosure are intended to cover all modifications, equivalents and alternatives to the various implementations as defined by the appended claims. Moreover, with respect to the one or more methods or processes of the present disclosure described herein, orders in which such methods or processes are presented are not intended to be construed as any limitation on the claimed inventions, and any number of the method or process steps or boxes described herein can be combined in any order and/or in parallel to implement the methods or processes described herein. Also, the drawings herein are not drawn to scale.

Conditional language, such as, among others, "can," "could," "might," or "may," unless specifically stated otherwise, or otherwise understood within the context as used, is generally intended to convey in a permissive manner that certain implementations could include, or have the potential to include, but do not mandate or require, certain features, elements and/or steps. In a similar manner, terms such as "include," "including" and "includes are generally intended to mean "including, but not limited to." Thus, such conditional language is not generally intended to imply that features, elements and/or steps are in any way required for one or more implementations or that one or more implementations necessarily include logic for deciding, with or without user input or prompting, whether these features, elements and/or steps are included or are to be performed in any particular implementation.

Disjunctive language such as the phrase "at least one of X, Y, or Z," or "at least one of X, Y and Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain implementations require at least one of X, at least one of Y, or at least one of Z to each be present.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C.

Language of degree used herein, such as the terms "about," "approximately," "generally," "nearly" or "substantially" as used herein, represent a value, amount, or characteristic close to the stated value, amount, or characteristic that still performs a desired function or achieves a desired result. For example, the terms "about," "approximately," "generally," "nearly" or "substantially" may refer to an amount that is within less than 10% of, within less than 5% of, within less than 1% of, within less than 0.1% of, and within less than 0.01% of the stated amount.

Although the invention has been described and illustrated with respect to illustrative implementations thereof, the foregoing and various other additions and omissions may be made therein and thereto without departing from the spirit and scope of the present disclosure.

What is claimed is:

1. A modular distribution assembly comprising:
   a first frame defining a first cavity at least in part, wherein the first frame comprises:
      a first side panel having a first opening and a second opening;
      a second side panel, wherein the second side panel is aligned substantially parallel to the first side panel, and wherein the second side panel and the first side panel have a common length;
      a first end door joined to one of the first side panel or the second side panel by at least a first hinge; and
      a second end door joined to one of the first side panel or the second side panel by at least a second hinge, wherein the second end door is aligned substantially parallel to the first end door, wherein the second end door and the first end door have a common length, wherein the first side panel, the second side panel, the first end door and the second end door have a common height, and wherein the first cavity has a substantially rectangular cross-section defined at least in part by the first side panel, the second side panel, the first end door and the second end door;
   a first access box having a first access door, wherein a third side panel of the first access box is mounted to the first side panel over the first opening, wherein the third side panel comprises a third opening aligned with the first opening, and wherein the first access door is joined to the first access box by at least a third hinge;
   a first cable extending between at least the first access box and the cavity through the first opening and the third opening, wherein a first end of the first cable is coupled to a component within the cavity, and wherein the component comprises at least one of a router, a modem, a transformer, a patch panel, or a network switch;
   a second access box having a second access door, wherein a fourth side panel of the second access box is mounted to the first side panel over the second opening, wherein the fourth side panel comprises a fourth opening aligned with the second opening, and wherein the second access door is joined to the second access box by at least a fourth hinge;
   a second cable extending between at least the second access box and the cavity through the second opening and the fourth opening, wherein a second end of the second cable is coupled to the component within the cavity;
   a top panel joined to the first frame, wherein the top panel comprises a third opening, wherein the top panel has a length not less than the common length of the second side panel and the first side panel, and wherein the top panel has a width not less than the common length of the first end door and the second end door; and
   a plinth provided below the first frame, wherein the plinth rests on a ground surface.

2. The modular distribution assembly of claim 1, wherein the first cable carries current at a first voltage level,
   wherein the second cable carries current at a second voltage level, and
   wherein the first voltage level exceeds the second voltage level.

3. The modular distribution assembly of claim 1, wherein each of the first side panel, the second side panel, the first end door, the second end door, the top panel, the first access box and the second access box is formed at least in part from steel having a thickness between approximately 0.050 inches and approximately 0.100 inches.

4. The modular distribution assembly of claim 1, further comprising a second frame disposed between the first frame and the plinth,
   wherein the second frame defines the first cavity at least in part, and
   wherein the second frame further comprises:
      a fifth side panel having a fifth opening;
      a sixth side panel, wherein the sixth side panel is aligned substantially parallel to the fifth side panel, and wherein the fifth side panel and the sixth side panel have the common length of the first side panel and the second side panel;
      a third end door joined to one of the fifth side panel or the sixth side panel by at least a fifth hinge; and
      a fourth end door joined to one of the fifth side panel or the sixth side panel by at least a sixth hinge, wherein the fourth end door is aligned substantially parallel to the third end door, wherein the fourth end door and the third end door have the common length of the first end door and the second end door, and wherein the fifth side panel, the sixth side panel, the third end door and the fourth end door have the common height of the first side panel, the second side panel, the first end door and the second end door.

5. An assembly comprising:
   a first frame comprising:
      a first panel having a first length and a first height, wherein the first panel comprises a first opening and a second opening extending therethrough;
      a second panel having the first length and the first height, wherein the second panel is aligned parallel to the first panel;
      a first door rotatably mounted to at least one of the first panel or the second panel by at least a first hinge, wherein the first door has a second length and the first height, wherein the second length is less than the first length, and wherein the first door is perpendicular to each of the first panel and the second panel; and
      a second door rotatably mounted to at least one of the first panel or the second panel by at least a second hinge, wherein the second door has the second length and the first height, wherein the second door is perpendicular to each of the first panel and the second panel, and wherein the first panel, the second panel, the first door and the second door define at least a portion of a first cavity;
   a third panel provided atop the first frame, wherein the third panel has a length not less than a distance between the first door and the second door and a width not less than a distance between the first panel and the second panel;

a first access box comprising a third door, wherein the first access box is mounted to the first panel over the first opening, wherein the first access box defines a second cavity at least in part, and wherein the first cavity and the second cavity are connected via the first opening and a third opening in the first access box; and a second access box comprising a fourth door, wherein the second access box is mounted to the first panel over the second opening, wherein the second access box defines a third cavity at least in part, and wherein the first cavity and the third cavity are connected via the second opening and a fourth opening in the second access box; and at least one connector having a first end within an interior of the first cavity and a second end external to the first cavity, wherein the at least one connector extends from the interior of the first cavity into the first access box via the first opening and the third opening.

6. The assembly of claim 5, further comprising:
a second frame comprising:
- a fourth panel having the first length and the first height, wherein the fourth panel comprises a fifth opening extending therethrough;
- a fifth panel having the first length and the first height, wherein the fifth panel is aligned parallel to the fourth panel;
- a fifth door rotatably mounted to at least one of the fourth panel or the fifth panel, wherein the fifth door has the second length and the first height, and wherein the fifth door is perpendicular to each of the fourth panel and the fifth panel; and
- a sixth door rotatably mounted to at least one of the fourth panel or the fifth panel, wherein the sixth door has the second length and the first height, wherein the sixth door is perpendicular to each of the fourth panel and the fifth panel, and wherein the fourth panel, the fifth panel, the fifth door and the sixth door define at least a portion of the first cavity; and
- a third access box comprising a seventh door, wherein the third access box is mounted to the fourth panel over the fifth opening, wherein the first access box is coaligned with the third access box, wherein the third access box defines the second cavity at least in part, and wherein the first cavity and the second cavity are connected via the fifth opening and a sixth opening in the third access box, wherein the first frame rests atop the second frame,
wherein the first panel is aligned in a common plane with the fourth panel, and
wherein the second panel is aligned in a common plane with the fifth panel.

7. The assembly of claim 6, wherein the third door is coupled to the seventh door by a joiner, and
wherein one of the third door or the seventh door comprises a lock for securing the third door and the seventh door in closed positions.

8. The assembly of claim 6, wherein the fourth panel further comprises a seventh opening, and
wherein the assembly further comprises:
- a fourth access box comprising an eighth door, wherein the fourth access box is mounted to the fourth panel over the seventh opening, wherein the fourth access box defines the third cavity at least in part, and wherein the first cavity and the third cavity are connected via the seventh opening and an eighth opening in the fourth access box.

9. The assembly of claim 5, wherein each of the first panel, the second panel, the third panel, the first door, the second door, the first access box and the second access box is formed at least in part from steel having a thickness between approximately 0.050 inches and approximately 0.100 inches.

10. The assembly of claim 5, wherein a first edge of the first door is rotatably mounted to the second panel by at least the first hinge,
wherein the first door comprises a first latch configured to releasably couple the first door to at least the first panel when the first door is in a closed position,
wherein a first edge of the third door is rotatably mounted to at least a portion of the first access box by a third hinge,
wherein a second edge of the third door comprises an extension configured to receive at least a second edge of the first door therein, and
wherein the extension extends over the second edge of the first door when the third door is in a closed position.

11. The assembly of claim 5, wherein the first access box is joined to the first panel by at least one reverse-facing carriage bolt.

12. The assembly of claim 5, wherein the first door comprises a fan mounted therein, and
wherein a flow of air from an exterior of the first frame to an interior of the first cavity is initiated by operation of the fan.

13. The assembly of claim 5, further comprising at least one switch associated with the first door,
wherein the switch is configured to at least one of:
permit operation of a fan mounted in the first door when the first door is in a closed position;
inhibit the operation of the fan when the first door is not in the closed position;
transmit at least a first signal to an external computer system when the first door is in the closed position;
transmit at least a second signal to the external computer system when the first door is not in the closed position;
deactivate a light within the first cavity when the first door is in the closed position; or
activate the light within the first cavity when the first door is not in the closed position.

14. The assembly of claim 5, wherein the first door comprises at least one louver extending therethrough, and
wherein the at least one louver permits a flow of air from an exterior of the first frame to an interior of the first cavity.

15. The assembly of claim 5, further comprising a plinth having an upper surface, and
wherein the first frame rests on the upper surface of the plinth.

16. The assembly of claim 5, further comprising a shelf and at least one bracket,
wherein the first frame rests on the shelf, and
wherein the shelf is joined to a wall by the at least one bracket.

17. The assembly of claim 5, wherein at least one of a router, a modem, a transformer, a network switch or a patch panel is disposed within the first cavity, and
wherein the first end of the at least one connector is coupled to the at least one of the router, the modem, the transformer, the network switch or the patch panel.

18. An assembly mounted to a wall, wherein the assembly comprises:
a first frame comprising:
a first panel having a first length and a first height, wherein the first panel comprises a first opening and a second opening extending therethrough;
a second panel having the first length and the first height, wherein the second panel is aligned parallel to the first panel;
a first door rotatably mounted to at least one of the first panel or the second panel by at least a first hinge, wherein the first door has a second length and the first height, wherein the second length is less than the first length, and wherein the first door is perpendicular to each of the first panel and the second panel; and
a second door rotatably mounted to at least one of the first panel or the second panel by at least a second hinge, wherein the second door has the second length and the first height, wherein the second door is perpendicular to each of the first panel and the second panel, and wherein the first panel, the second panel, the first door and the second door define at least a portion of a first cavity;
a third panel provided atop the first frame, wherein the third panel has a length not less than a distance between the first door and the second door and a width not less than a distance between the first panel and the second panel;
a first access box comprising a third door, wherein the first access box is mounted to the first panel over the first opening, wherein the first access box defines a second cavity at least in part, and wherein the first cavity and the second cavity are connected via the first opening and a third opening in the first access box;
a second access box comprising a fourth door, wherein the second access box is mounted to the first panel over the second opening, wherein the second access box defines a third cavity at least in part, and wherein the first cavity and the third cavity are connected via the second opening and a fourth opening in the second access box;
a component disposed within the first cavity, wherein the component comprises at least one of a router, a modem, a transformer, a patch panel, or a network switch;
at least a first cable extending from an interior of the first cavity to an exterior of the first frame via the first opening and the first access box;
at least a second cable extending from the interior of the first cavity to the exterior of the first frame via the second opening and the second access box;
a first shelf, wherein the first frame rests on the first shelf; and
a plurality of brackets, wherein each of the plurality of brackets extends laterally from the wall to support the first shelf.

19. The assembly of claim 18, wherein the first cable carries current at a first voltage level,
wherein the second cable carries current at a second voltage level, and
wherein the first voltage level exceeds the second voltage level.

20. The assembly of claim 18, wherein each of the first panel, the second panel, the third panel, the first door, the second door, the first access box and the second access box is formed at least in part from steel having a thickness between approximately 0.050 inches and approximately 0.100 inches.

* * * * *